(12) United States Patent
Bradshaw

(10) Patent No.: US 10,802,907 B2
(45) Date of Patent: Oct. 13, 2020

(54) HIERARCHICAL BUFFERING SCHEME TO NORMALIZE NON-VOLATILE MEDIA RAW BIT ERROR RATE TRANSIENTS

(71) Applicant: Micron Technology, Inc., Boise, ID (US)

(72) Inventor: Samuel E. Bradshaw, Sacramento, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 152 days.

(21) Appl. No.: 15/926,973

(22) Filed: Mar. 20, 2018

(65) Prior Publication Data
US 2019/0294493 A1 Sep. 26, 2019

(51) Int. Cl.
| | | |
|---|---|---|
| *G06F 11/00* | (2006.01) | |
| *G06F 11/08* | (2006.01) | |
| *G06F 3/06* | (2006.01) | |
| *G11C 13/00* | (2006.01) | |
| *G06F 11/07* | (2006.01) | |

(52) U.S. Cl.
CPC .......... *G06F 11/085* (2013.01); *G06F 3/0619* (2013.01); *G06F 3/0652* (2013.01); *G06F 3/0656* (2013.01); *G06F 3/0685* (2013.01); *G06F 11/076* (2013.01); *G06F 11/0727* (2013.01); *G06F 11/0793* (2013.01); *G11C 13/0004* (2013.01)

(58) Field of Classification Search
CPC ............... G06F 11/0727; G06F 11/076; G06F 11/0793; G06F 11/108; G06F 11/10
See application file for complete search history.

(56) References Cited

U.S. PATENT DOCUMENTS

| | | | |
|---|---|---|---|
| 5,416,915 A | * | 5/1995 | Mattson ................ G06F 3/0601 711/114 |
| 6,067,636 A | * | 5/2000 | Yao ..................... G06F 11/1076 348/E5.008 |
| 9,257,169 B2 | | 2/2016 | Jung, II et al. |
| 9,263,128 B2 | | 2/2016 | Fantini et al. |
| 9,653,176 B2 | | 5/2017 | Cai et al. |
| 9,711,234 B1 | | 7/2017 | Van Gaasbeck et al. |
| 9,940,991 B2 | | 4/2018 | Kim et al. |

(Continued)

OTHER PUBLICATIONS

Final Office Action from U.S. Appl. No. 15/926,986, dated Mar. 15, 2019, 13 pages.

(Continued)

*Primary Examiner* — Charles Ehne
(74) *Attorney, Agent, or Firm* — Nicholson De Vos Webster & Elliott LLP

(57) ABSTRACT

A computer-implemented method for writing data to a first media using a set of data structures to reduce potential errors when reading the data from the first media is described. The method includes writing, user data to a set of memory cells in the first media; and storing, in response to writing the user data to the set of memory cells, a first set of parity bits associated with the user data in a first buffer that is held within a second media separate from the first media and is a different type than the first media, wherein the first set of parity bits provide error correction information for correcting errors introduced to the user data while stored in the set of memory cells or read from the set of memory cells.

18 Claims, 11 Drawing Sheets

(56) References Cited

U.S. PATENT DOCUMENTS

| | | |
|---|---|---|
| 10,049,755 B2 | 8/2018 | Lee et al. |
| 2003/0133497 A1* | 7/2003 | Kinjo .................... H04L 1/0041 |
| | | 375/152 |
| 2007/0180297 A1* | 8/2007 | Byrne ................. G06F 11/1076 |
| | | 714/6.12 |
| 2008/0270714 A1* | 10/2008 | Van Den Bosch .......................... |
| | | H03M 13/2707 |
| | | 711/157 |
| 2016/0034194 A1 | 2/2016 | Brokhman et al. |
| 2017/0269992 A1 | 9/2017 | Bandic et al. |
| 2017/0277450 A1* | 9/2017 | Ish ..................... G06F 12/0866 |
| 2018/0341606 A1* | 11/2018 | Bolkhovitin ............ G06F 3/061 |

OTHER PUBLICATIONS

Notice of Allowance from U.S. Appl. No. 15/926,986, dated Jun. 4, 2019, 5 pages.
Non-Final Office Action from U.S. Appl. No. 15/926,986, dated Nov. 9, 2018, 11 pages.
Non-Final Office Action, U.S. Appl. No. 16/460,538, dated Jun. 2, 2020, 13 pages.

* cited by examiner

HIERARCHICAL BUFFERING SCHEME TO NORMALIZE NON-VOLATILE MEDIA RAW BIT ERROR RATE TRANSIENTS

FIELD OF THE INVENTION

The various embodiments described in this document relate to managing memory devices. In particular, embodiments include systems and methods for optimizing codeword correction during the settling phase of phase change media.

BACKGROUND OF THE INVENTION

Research and development of commercially viable memory devices that are randomly accessed, have relatively low power consumption, and are non-volatile is ongoing. One ongoing area of research is in resistive memory cells where resistance states can be changed. One avenue of research relates to devices that store data in memory cells by structurally or chemically changing a physical property of the memory cells in response to applied write voltages and/or current, which in turn changes cell resistance. A controller uses a voltage read reference to detect the resistivity. An example of a variable resistance memory device includes memories using phase changing glasses (e.g., chalcogenide glass). The change in physical property, or phase change, is a transition and, within a population of phase change cells, there exists a distribution of transition latencies. The tails/ends of this distribution is problematic as a clear set of read/demarcation voltages may be difficult to ascertain. Further, delaying accesses to accommodate the tails/ends of the distribution erodes the fundamental value proposition of phase change memory (i.e., read times may be lengthened).

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
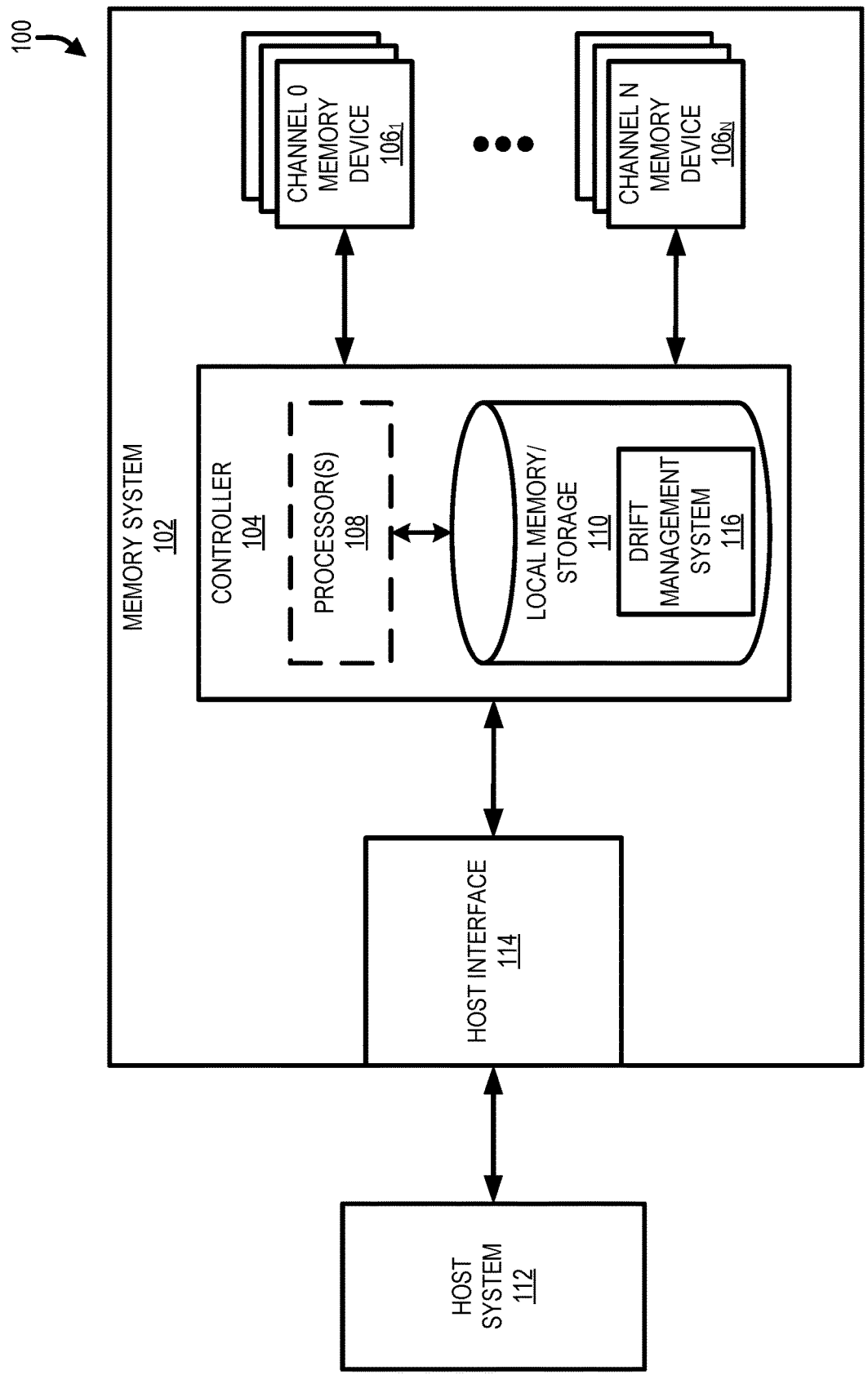
FIG. 1 is a functional block diagram of a computing system, including at least one memory system, in accordance with one or more embodiments.

Systems, methods and devices are described herein for reducing bit error rates while maintaining efficiency in reading user data from phase change media. In particular, in one embodiment, a set of hierarchical data structures may be used for storing/buffering data that is employed when fulfilling read requests for user data stored in phase change media. In one embodiment, the hierarchical data structures may store one or more of user data and parity bits associated with the user data. For example, during a first period of time after the user data was written to the phase change media (e.g., from zero to one-hundred milliseconds), a drift management system may instruct a controller to access the user data from a drift data buffer, which is part of the set of hierarchical data structures. The drift data buffer may be of limited size and be configured to support the accessing of user data during an initial period of time (e.g., the first period of time) following the writing of the user data to the phase change media. During this initial or first period, the phase change memory cells used to store the user data in the phase change media undergo a rapid resistivity drift. Thus, reading data directly from the phase change media during this period may be particularly error prone. Following the first period of time and during a second period of time since the writing of the user data to the phase change media, memory cell resistivity drift may have somewhat slowed (in comparison to the first period of time). As a result, utilizing buffered user data from the data drift buffer may be unnecessary during this second period. In particular, the set of hierarchical data structures no longer need to store the user data in its entirety as accessing the user data from the phase change memory is less error prone (in comparison to the first period of time). Instead, buffered parity bits stored in the set of hierarchical data structures may be used to correct for errors while reading the user data from the phase change media. These buffered parity bits may provide stronger error correction than parity bits stored with the user data in the phase change media. As such, the buffered parity bits may correct for a considerable number of errors that may be introduced during reads of the user data and while the memory cells of the phase change media continue to drift after the write operation (e.g., a program operation which obtains write access). Following the second period of time, the memory cells may have sufficiently slowed down their resistivity drift such that reading the user data directly from the phase change media and using only the parity bits stored along with the user data in the phase change media will be adequate to decode the user data and produce a valid codeword. As described above and as will be described in greater detail below, the use of the set of hierarchical data structures to store one or more of user data and parity bits may allow for efficient reads of phase change media, particularly after write operations when the phase change media memory cells are going through high rates of resistivity drift.

FIG. 1 is a functional block diagram of a computing system 100, including at least one memory system 102, in accordance with one or more embodiments of the present disclosure. In general, the computing system 100 can include a host system 112 that uses the memory system 102. For example, the host system 112 can write data to the memory system 102 and read data from the memory system 102.

In the embodiment illustrated in FIG. 1, the memory system 102 includes a controller 104 and one or more memory devices $106_1$-$106_N$, which may correspond to separate memory channels. In this example, the controller 104 is external to the one or more memory devices $106_1$-$106_N$. The memory devices $106_1$-$106_N$ can provide a storage volume for the memory system 102 and/or the computing system 100 (e.g., the memory devices $106_1$-$106_N$ may be formatted with a particular file system for use by the computing system 100). The controller 104 includes control circuitry (e.g., hardware, firmware, and/or software) for controlling/managing the memory devices $106_1$-$106_N$. In one or more embodiments, the controller 104 is an application specific integrated circuit (ASIC) coupled to a printed circuit board, including a physical interface to the memory devices $106_1$-$106_N$. The controller 104 can utilize one or more processors 108 and/or local memory/storage 110 for use in controlling/managing the memory devices $106_1$-$106_N$. The processor 108 can be a central processing unit, microprocessor, integrated circuit, field programmable gate array, or other circuitry to read, write, and may maintain memory content as well as perform the embodiments set forth in this document and described (e.g., with reference to FIGS. 2-8).

The host system 112 can be a computing device such as a desktop computer, laptop computer, network server, mobile device, a memory card reader, an interface hub, among other host systems, and can include a memory access device (e.g., one processor (processing device) or multiple processors configured in a parallel processing system or as coprocessors). For example, in one embodiment, the computing system 100 is a personal computer and the host system 112 comprises a central processing unit that carries out the instructions of a computer program by performing the basic arithmetic, logical, control and input/output (I/O) operations specified by the instructions. One or more of these instructions may include or require access (e.g., read or write access) to user data stored in the memory devices $106_1$-$106_N$. Accordingly, the host system 112 may request access to the memory devices $106_1$-$106_N$ via commands or instructions passed to the controller 104 via the host interface 114.

The memory system 102 can include volatile memory devices, non-volatile memory devices, or a combination of volatile and non-volatile memory devices. The memory system 102 can be a storage system (e.g., solid-state drive (SSD)) to be used for data storage in the computing system 100. As a storage system, the memory system 102 can include memory devices $106_1$-$106_N$ that are non-volatile memory devices. For example, the memory devices $106_1$-$106_N$ may be a negative-and (NAND) type flash memory. Each of the memory devices $106_1$-$106_N$ can include one or more arrays of memory cells such as single level cells (SLCs), multi-level cells (MLCs), or quad-level cells (QLCs). Each of the memory cells can store bits of data (e.g., data blocks) used by the host system 112. Although non-volatile memory devices, such as NAND type flash memory, are described, the memory devices $106_1$-$106_N$ can be based on any other type of memory. For example, the memory devices $106_1$-$106_N$ can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, and electrically erasable programmable read-only memory (EEPROM).

In one embodiment, memory devices $106_1$-$106_N$ are a cross-point array of non-volatile memory cells. Cross-point non-volatile memory can perform bit storage based on a change of bulk resistance, in conjunction with a stackable cross-gridded data access array. Additionally, cross point non-volatile memory can perform a write in-place operation (in contrast to many types of Flash-based memory), where a non-volatile memory cell may be programmed without the non-volatile memory cell being previously erased.

The host system 112 can be coupled to the memory system 102 via a host interface 114. In one or more embodiments, the host interface 114 is a standardized physical interface. For example, when the memory system 102 is used for data storage in the computing system 100, the host interface 114 may be a serial advanced technology attachment (SATA) interface, a peripheral component interconnect express (PCIe) interface, a universal serial bus (USB) interface, Fibre Channel, serial attached small computer system interface (SCSI) (SAS), among other standardized connectors and interfaces. The host system 112 can further utilize an non-volatile memory (NVM) Express (NVMe) interface to access the memory devices $106_1$-$106_N$ when the memory system 102 is coupled with the host system 112 by the PCIe interface. In some embodiments, the memory system 102 is a hybrid memory/storage system.

The host interface 114 can provide an interface for passing control, address, data, and other signals between the memory system 102 and the host system 112. In general, however, the host interface 114 can be comprised of any set of circuitry and protocols that provide an interface for passing control, address, data, and other signals between the memory system 102 and the host system 112.

The controller 104 can communicate with the memory devices $106_1$-$106_N$ to read or write user data, among other operations. The controller 104 can have circuitry that includes one or more integrated circuits, discrete components, and/or code/instructions for managing/controlling the memory devices $106_1$-$106_N$. For example, the local memory/storage 110 can include the drift management system 116, which, as will be described in greater detail below, includes or can use hierarchical data structures and/or logic for accessing the memory devices $106_1$-$106_N$ in an efficient matter by caching/storing user data and/or parity bits (sometimes referred to as error correction codes (ECCs)) for user data stored in the memory devices $106_1$-$106_N$. The controller 104 couples to a connection/interface of each memory device $106_1$-$106_N$ to receive or transmit the appropriate signal at the appropriate time to carry out an operation (e.g., reading or writing user data). In some embodiments, the communication protocol between the host system 112 and the memory system 102 is different than the protocol used by the controller 104 for access of a memory device $106_1$-$106_N$. In these embodiments, the controller 104 may translate the commands/signals received from the host system 112 into the appropriate commands/signals to achieve the desired access to a memory device $106_1$-$106_N$.

Each memory device $106_1$-$106_N$ can include one or more arrays of memory cells (e.g., non-volatile memory cells). The memory devices $106_1$-$106_N$ may each include a number of memory cells that can be grouped. As used herein, a group can include one or more memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can include 4314 bytes of data per page, 128 pages per block, 2048 blocks per plane, and 16 planes per device. Sets of memory cells in a memory device 106 may be referenced using an assigned address. In particular, an address may be assigned to one or more memory cells in a memory device 106 such that the address may be used for accessing the corresponding memory cells (e.g., reading the one or more memory cells or writing to the one or more memory cells).

A group of memory cells in a memory device 106 may be used for storing user data (e.g., codewords). For example, each memory cell in a memory device 106 may be used for storing a single bit of user data. In some embodiments, the user data stored in the memory devices $106_1$-$106_N$ include or are stored along with parity bits that are used to correct for errors introduced while the user data is stored in the memory devices $106_1$-$106_N$ and/or while the user data is being read from the memory devices $106_1$-$106_N$. For example, the errors may be caused by the noise experienced by the memory devices $106_1$-$106_N$ (e.g., electromagnetic radiation), which causes bits to be flipped in the memory devices $106_1$-$106_N$ and/or errors caused by reading (e.g., using an improper read/demarcation voltage).

The memory devices $106_1$-$106_N$ may be resistance memory devices such that each of the memory cells that make up a memory device 106 is a resistance memory cell. For example, each memory device $106_1$-$106_N$ can represent a die providing three-dimensional phase change material and switching (PCMS) memory. In such an embodiment, each of the memory cells of the memory devices $106_1$-$106_N$ is a phase change memory cell.

Figure 2:
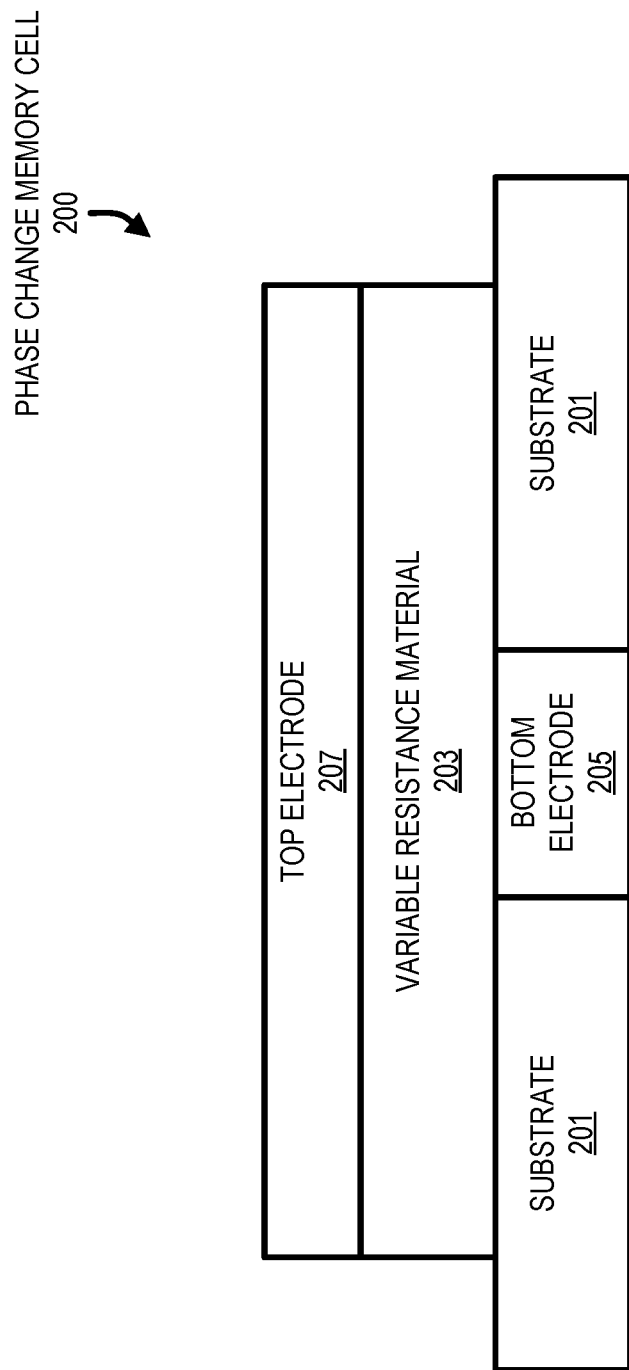
FIG. 2 shows a basic composition of a phase change memory cell constructed over a substrate, having a variable resistance material formed between a bottom electrode and a top electrode, in accordance with one or more embodiments.

FIG. 2 shows a basic composition of a phase change memory cell 200 (e.g., in a memory device $106_1$-$106_N$) constructed over a substrate 201, having a variable resistance material 203 formed between a bottom electrode 205 and a top electrode 207. One type of variable resistance material 203 can be amorphous silicon doped with V, Co, Ni, Pd, Fe and Mn. Another type of variable resistance material 203 can include perovskite materials such as Pr(1-x)CaxMnO3 (PCMO), La(1-xCaxMnO3(LCMO), LaSrMnO3 (LSMO), or GdBaCoxOy (GBCO). Still another type of variable resistance material 203 can be a doped chalcogenide glass of the formula AxBy, where B is selected from among S, Se and Te and mixtures thereof, and where A includes at least one element from Group III-A (B, Al, Ga, In, Tl), Group IV-A (C, Si, Ge, Sn, Pb), Group V-A (N, P, As, Sb, Bi), or Group VII-A (F, Cl, Br, I, At) of the periodic table, and with the dopant being selected from among the noble metals and transition metals, including Ag, Au, Pt, Cu, Cd, Jr, Ru, Co, Cr, Mn or Ni. Yet another type of variable resistance material 203 includes a carbon-polymer film comprising carbon black particulates or graphite, for example, mixed into a plastic polymer. The material used to form the illustrated bottom and top electrodes 205 and 207 may be selected from a variety of conductive materials, such as tungsten, nickel, tantalum, titanium, titanium nitride, aluminum, platinum, or silver, among others.

The variable resistance material 203 can be in an amorphous phase or a crystalline phase. The resistance of the variable resistance material 203 is different when in the amorphous phase in comparison to when in the crystalline phase. In particular, the variable resistance material 203 has a higher resistivity when in the amorphous phase than when in the crystalline phase. As described herein, the phase of the variable resistance material 203 and by extension the resistivity of the variable resistance material 203 may be equated, linked, or otherwise associated with a binary value. In one example embodiment, the amorphous phase with a first resistivity (or first resistivity range) corresponds to a binary value of "0" or False (i.e., a reset/unset state) and the crystalline phase with a second resistivity (or second resistivity range) corresponds to a binary value of "1" or True (i.e., a set state). In other embodiments, the association between phases/resistivity of the variable resistance material 203 and binary values can be switched/flipped.

Although the variable resistance material 203 has been described as having only two phases (e.g., an amorphous phase and a crystalline phase), in other embodiments, the variable resistance material 203 can have more than two phases. For example, the variable resistance material 203 can have a single amorphous phase and two crystalline phases (e.g., cubic and hexagonal crystalline phases). For purposes of explanation, the variable resistance material 203 will be described in relation to two phases (e.g., an amorphous phase and a crystalline phase); however, the systems, methods, and devices described herein may operate similarly when the variable resistance material 203 has more than two phases.

The transition from one phase to another phase (e.g., from the amorphous phase to the crystalline phase or from the crystalline phase to the amorphous phase) occurs in response to temperature changes of the variable resistance material 203. The temperature changes (i.e., heating and cooling) may be caused by passing differing strengths of current through the variable resistance material 203. For example, the electrodes 205 and 207 can place the variable resistance material 203 in a crystalline phase by passing a crystallizing current through the variable resistance material 203, thus warming the variable resistance material 203 to a temperature wherein a crystalline structure may grow. The electrodes 205 and 207 can use a stronger melting current to melt the variable resistance material 203 for subsequent cooling to the amorphous phase. When the phase change memory cell 200 uses the crystalline phase to represent a binary value of "1" or True and the amorphous phase to represent a binary value of "0" or False, the crystallizing current can be referred to as a write or set current and the melting current can be referred to as an erase or reset current. However, as described above, the assignment of phases to binary values can be switched.

In one embodiment, the memory system 102 uses the electrodes 205 and 207 for determining a phase of the variable resistance material 203 and thus determine a binary value represented by the current phase of the variable resistance material 203. For example, the electrodes 205 and 207 can be coupled to a selector and the selector can act as a switch to selectively allow a variable voltage across the variable resistance material 203. When the resistivity of the variable resistance material 203 is high (i.e., the variable resistance material 203 is in an amorphous phase), the voltage used must be sufficiently high to overcome the resistivity of the variable resistance material 203. If the voltage is not sufficiently high, current will not pass through the variable resistance material 203 and the selector will snap back open. In contrast, when the variable resistance material 203 has a lower resistivity (e.g., the variable resistance material 203 is in a crystalline phase), the same voltage that was not able to pass through the variable resistance material 203 when at a higher resistivity (e.g., the variable resistance material 203 is in the amorphous phase) will pass through the variable resistance material 203 without snapping the selector back open (i.e., the selector remains closed). Thus, applying a current with a specific voltage allows the phase of the variable resistance material 203 to be determined such that data stored in or represented by the variable resistance material 203 can be read.

Although the variable resistance material 203 of a phase change memory cell 200 is described above as being in one phase or another (e.g., metastable in an amorphous phase or a crystalline phase) and having a discrete resistivity while in that corresponding phase, the resistivity of the variable resistance material 203 may be in constant transition or may be constantly drifting. Namely, the resistivity of the variable resistance material 203 may vary (i.e., decelerate) over time as it attempts to settle. The rate of the change is highest when the variable resistance material 203 is initially written to a particular phase and the rate of change is reduced over time until a constant rate of resistivity change is reached (e.g., after the passage of a few hundred seconds). The rate of resistivity change can be dependent on the phase of the variable resistance material 203. For example, when the variable resistance material 203 of a phase change memory cell 200 is in the crystalline phase (i.e., the phase change memory cell 200 is set) the rate of resistivity change can be higher than when the variable resistance material 203 is in the amorphous phase (i.e., the phase change memory cell 200 is reset/unset).

Accordingly, the voltage applied by a selector of the phase change memory cell 200 may need to be time-dependent (i.e., relative to the time from when the phase change memory cell 200 was last written) to allow the phase of the variable resistance material 203 to be determined while the resistivity of the variable resistance material 203 is drifting. For example, three different voltage levels can be used to determine/read the phase of the variable resistance material 203, where each voltage level corresponds to a different time frame from when the variable resistance material 203 was last written. For example, a first voltage level can correspond to the time immediately after the variable resistance material 203 was last written (i.e., time zero) until one-hundred seconds has elapsed, a second voltage level can correspond to one-hundred seconds until twelve hours has elapsed, and a third voltage level can correspond to twelve hours and onward. The time ranges/periods may be different than the examples set forth in this document and/or may be adjusted. In some embodiments, the lowest voltage level is used initially to reduce the probability that a read operation will affect the phase of the variable resistance material 203. In particular, as noted above, the variable resistance material 203 can be coupled to a selector that is itself made from phase change material. Accordingly, the selector drifts in a similar fashion as the coupled variable resistance material 203. Increasing voltages with time is required to reach the threshold of this selector. However, increasing voltages also increases the current going through the variable resistance material 203 and thus the amount of heat the variable resistance material 203 receives. With a high enough voltage and with repetition, this can alter the state of the variable resistance material 203. The altered state can have a resistance that is indistinguishable as set or reset. As a result, a gentle approach is taken in which re-reads are performed with elevated voltages. If the controller 104 detects a valid codeword based on reading a set of phase change memory cells 200 (e.g., utilizing a decoder and parity bits stored in the set of phase change memory cells 200), re-reads of the phase change memory cells 200 with other voltage levels are not necessary. However, if a valid codeword is not determined, the next lowest/higher voltage level is utilized. This pattern continues until either a valid codeword is determined (utilizing parity bits were appropriate) or the voltage levels are exhausted without producing a valid codeword.

Figure 3A:
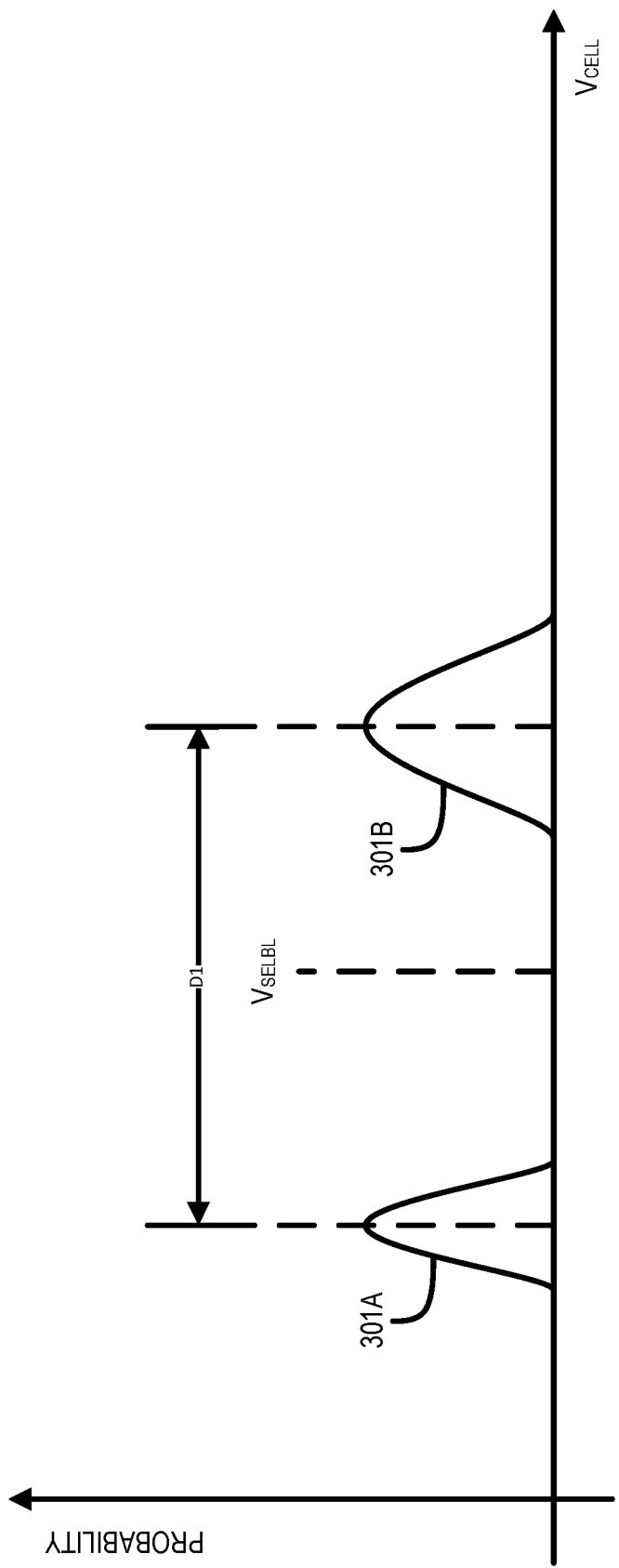
FIG. 3A shows a distribution at time T1 of detecting a phase change memory cell in a crystalline phase and a distribution at time T1 of detecting a phase change memory cell in an amorphous phase, in accordance with one or more embodiments.
Figure 3B:
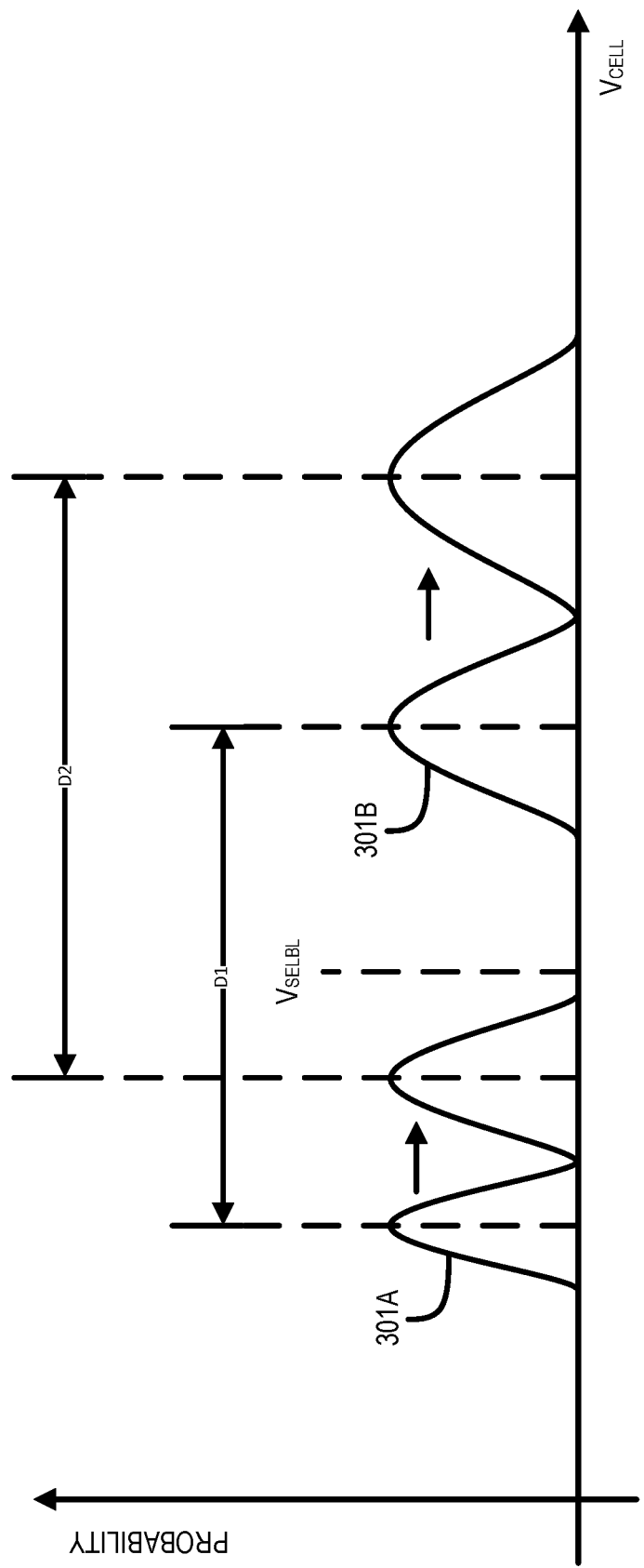
FIG. 3B shows an example of the distribution at time T2 of detecting a phase change memory cell in a crystalline phase and the distribution at time T2 of detecting a phase change memory cell in an amorphous phase, in accordance with one or more embodiments.
Figure 3C:
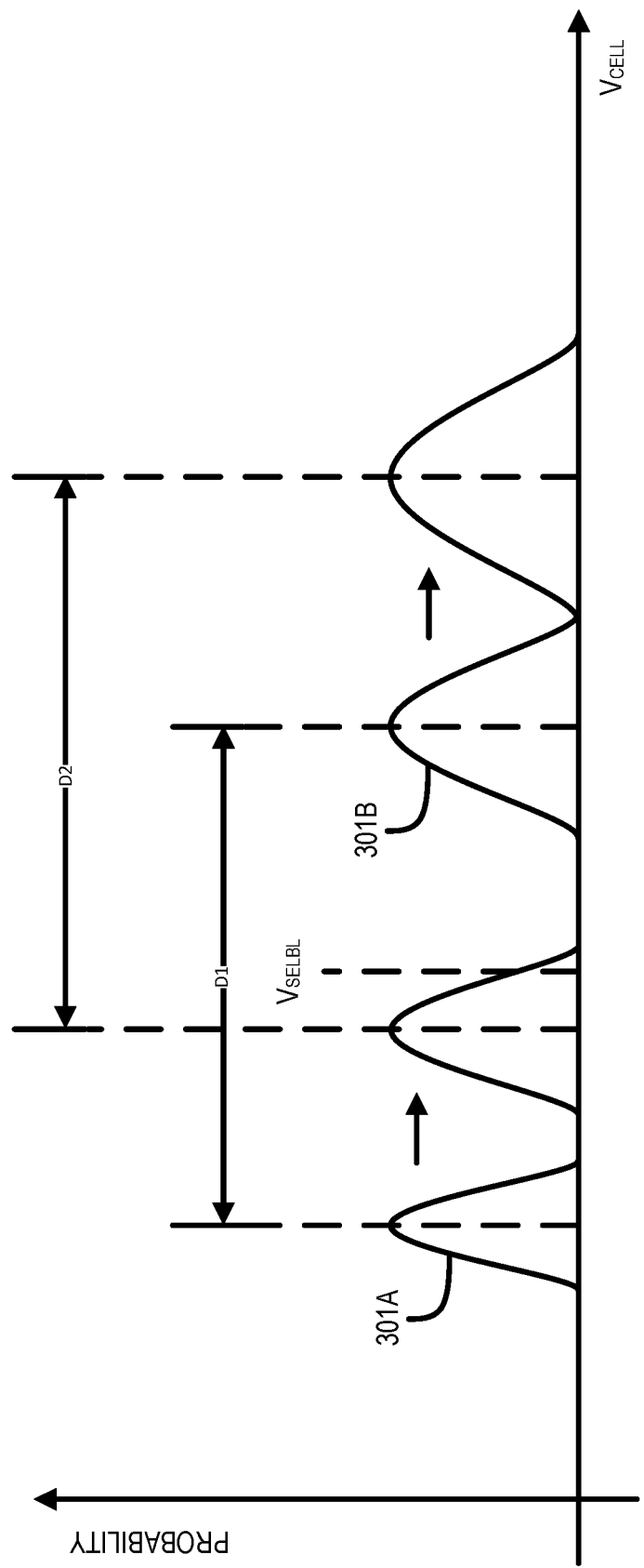
FIG. 3C shows another example of the distribution at time T2 of detecting a phase change memory cell in a crystalline phase and the distribution at time T2 of detecting a phase change memory cell in an amorphous phase, in accordance with one or more embodiments.

As noted above, although the phase of the variable resistance material 203 of the phase change memory cell 200 is metastable, the resistivity of the variable resistance material 203 changes with time (i.e., the variable resistance material 203 becomes more resistive). This change is more dramatic when the variable resistance material 203 is in the crystalline phase (i.e., the variable resistance material 203 is set) than when the variable resistance material 203 is in the amorphous phase. Thus, the gap between the resistivities of the two phases/states is widening. For example, FIG. 3A shows a distribution 301A at time T1 of detecting a phase change memory cell 200 in the crystalline phase (i.e., the variable resistance material 203 is set) when using the read/demarcation voltage $V_{SELBL}$ and a distribution 301B at time T1 of detecting a phase change memory cell 200 in the amorphous phase (i.e., the variable resistance material 203 is reset) when using the read/demarcation voltage $V_{SELBL}$. The read/demarcation voltage $V_{SELBL}$ is the voltage applied to a phase change memory cell 200 to determine the state of the phase change memory cell 200 and is selected to be between the distributions 301A and 301B corresponding to the two phases of the phase change memory cell 200. In this example, the distributions 301A and 301B are separated by a distance D2. The read/demarcation voltage $V_{SELBL}$ is in between the distributions 301A and 301B to maximize accuracy of reading phase change memory cells 200. However, as shown in FIG. 3B, at time T2, the distributions 301A and 301B have shifted at different rates, including shifts between individual phase change memory cells 200 in each phase, and are now separated by the distance D2, where D2>D1. The read/demarcation voltage $V_{SELBL}$ no longer has sufficient margin from (now shifted) distribution 301A. As a result of the shift, the accuracy of reading phase change memory cells 200 using read/demarcation voltage $V_{SELBL}$ has decreased. In some cases, as shown in FIG. 3C, the shifted distribution 301A can partially span voltage $V_{SELBL}$ resulting in misreads.

Based on the unequal changing resistivity of the variable resistance material 203 when in the amorphous and crystalline phases, determining a demarcation voltage (e.g., voltage $V_{SELBL}$) for reading the phase change memory cell 200 is difficult and can be prone to error. This issue is particularly prevalent just after a phase change memory cell 200 has been written (e.g., zero to one-hundred milliseconds after the phase of the variable resistance material 203 has been altered) as the resistivity of the variable resistance material 203 is at its highest level of transition/drift. As time elapses from the time the phase change memory cell 200 was written, using a defined demarcation voltage is less prone to producing a read error.

Figure 4A:
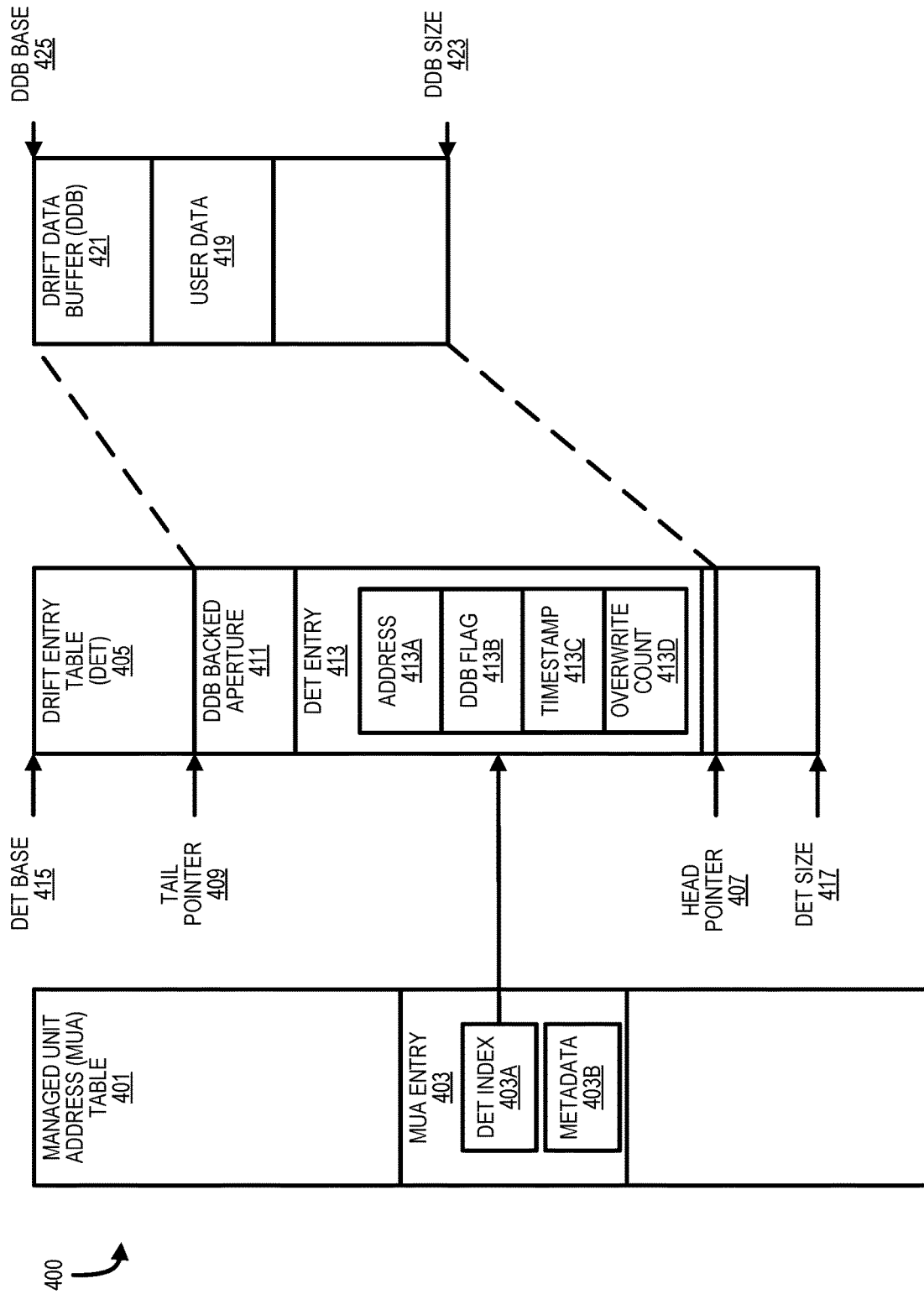
FIG. 4A shows a set of hierarchical data structures for accessing data from phase change memory cells, in accordance with one or more embodiments.

To address the above issues, a set of hierarchical data structures can be used for buffering/caching/storing user data that was recently written to phase change memory cells 200 and/or parity bits associated with the user data. FIG. 4A shows a set of hierarchical data structures 400 for accessing data from phase change memory cells 200 according to one example embodiment. The hierarchical data structures 400 can be stored in the local memory/storage 110 or any other location in the controller 104. In some embodiments, the drift management system 116 uses the hierarchical data structures 400 for managing access to the phase change memory cells 200 in an efficient matter by caching/storing user data and/or parity bits for user data stored in the memory devices 106$_1$-106$_N$, as will be described in greater detail below. In the illustrated embodiment, the hierarchical data structures 400 comprise a set of first-in-first-out buffers that allow reading of phase change memory cells 200 while they are going through different levels of resistivity drift.

As shown in FIG. 4A, the hierarchical data structures 400 includes a Managed Unit Address (MUA) table 401. The MUA table 401 can be used for indicating the location of data in a memory hierarchy. In one embodiment, the MUA table 401 includes MUA entries 403 corresponding to different phase change memory cells 200 or groups of phase change memory cells 200. In one embodiment, the drift management system 116 or another component of the local memory/storage 110 indexes the MUA entries 403 based on an address of the phase change memory cells 200 (e.g., indexed based on MUA addresses for the phase change memory cells 200). Although described as indexing based on a MUA address, the MUA entries 403 can be indexed using a logical index rather than physical index. In particular, an access request from a host system 112 can provide a logical address. Controller 104 uses the logical address to index the MUA table (e.g., the drift management system 116 can function to provide address translation). For example, the drift management system 116 via the MUA table 401 can identity map that logical address to a physical address (i.e., a group of phase change memory cells 200 in the topology) or the drift management system 116 can redirect that logical address to some non-identity mapped address for a group of phase change memory cells 200, supporting indirection between logical and physical.

The MUA table 401 references or points to a Drift Entry Table (DET) 405. For example, the MUA table 401 can include data corresponding to a head pointer 407 and a tail pointer 409 of a Drift Data Buffer (DDB) backed aperture 411 in the DET 405 (i.e., the in-use portion of the DET 405). Further, each of the MUA entries 403 can include a DET index 403A and/or metadata 403B. In one embodiment, the metadata 403B stores parity bits for user data 419, which provide stronger error correction (i.e., offer more bits for correction) than parity bits of the user data 419 stored in the phase change memory cells 200, while the DET index 403A of a MUA entry 403 is an offset (e.g., a pointer) to a DET entry 413 in the DDB backed aperture 411 of the DET 405. A MUA entry 403 can have a DET index 403A if a phase change memory cell 200 corresponding to the MUA entry 403 was written within a specified time period (e.g., zero seconds to one-milliseconds since the phase change memory cell 200 has been written). Each DET index 403A points to a single DET entry 413 such that the DET indices 403A and the DET entries 413 share a one-to-one relationship.

Each DET entry 413 can include various pieces of data. For example, in some embodiments, each DET entry 413 includes one or more of an address 413A (e.g., an MUA address corresponding to the MUA entry 403 and consequently the phase change memory cells 200 associated with the MUA entry 403); a DDB flag 413B indicating whether user data 419 associated with the phase change memory cells 200 have been stored/cached in the hierarchical data structures 400 (e.g., when the DDB flag 413B is set to true, user data 419 for the associated phase change memory cells 200 is stored/cached in the hierarchical data structures 400); a write timestamp 413C indicating when the associated phase change memory cells 200 were last written for use in determining disturbance effects to the phase change memory cells 200 relative to time; and an overwrite count 413D indicating the number of times associated phase change memory cells 200 have been overwritten for use in determining portions of the memory devices 106 that have been heavily overwritten and develop excessive wear or hotspots.

As noted above, the MUA table 401 can include data corresponding to a head pointer 407 and a tail pointer 409 of the DDB backed aperture 411. In particular, although the DET 405 can have a DET base 415 and a DET size 417 that may be fixed, the used portion of the DET 405 (i.e., the portion of the DET 405 that is being referenced by MUA entries 403 in the MUA table 401 and corresponds to the DDB backed aperture 411) can vary. Specifically, as noted above, MUA entries 403 can only have DET indices 403A when corresponding phase change memory cells 200 have been recently written. Thus, when the memory system 102 first turns-on and/or a corresponding host system 112 first boots, the phase change memory cells 200 may all have been written outside a relevant window of interest. Thus, the DET 405, and in particular the DDB backed aperture 411, may be empty.

As shown in FIG. 4A, the data corresponding to the head pointer 407 can be a pointer corresponding to the beginning of the DDB backed aperture 411 in the DET 405 and the data corresponding to the tail pointer 409 can be a pointer corresponding to the end of the DDB backed aperture 411 in the DET 405. In one embodiment, the head pointer 407 references an unused DET entry 413 whereas the tail pointer 409 can reference a used DET entry 413 (with the exception when the DET 405 is empty and the tail pointer 409 must reference an unused DET entry 413). When the DET 405, and in particular the DDB backed aperture 411, is empty, the head pointer 407 and the tail pointer 409 are equal and reference the first DET entry 413 (i.e., a DET entry 413$_0$). Updates to the head pointer 407 and the tail pointer 409 can be made modulus the DET size 417 to ensure the head pointer 407 and the tail pointer 409 remain in the range of the DET 405.

The DET 405, and accordingly the DDB backed aperture 411, is considered full when the difference between the head pointer 407 and the tail pointer 409 is equal to one less than the DET size 417. Based on this correspondence, the DET size 417 may be a power of two for optimization (i.e., produces optimized results for modulus/divide operations as the modulus/divide operation may be performed using a shift operation); however, in other embodiments, the DET size 417 may be of different sizes not tied to a power of two. The DET 405 will likely remain in a full state constantly as DET entries 413 will quickly fill the DET 405 as the controller 104 writes phase change memory cells 200 and the drift management system 116 constantly replaces DET entries 413 as time elapses and/or capacity of the DET 405 is reached (i.e., the number of DET entries 413 in the DET 405 reaches the DET size 417).

As noted above, the in-use portion of the DET 405 (i.e., the DET entries 413 between the head pointer 407 and the tail pointer 409) may be termed the DDB backed aperture 411. Each DET entry 413 can be related/associated with user data 419 in the DDB 421 as designated by a DDB offset. For example, the DDB offset (i.e., the location for user data 419 in the DDB 421) can be equal to the DET offset for the DET entry 413 modulus the DDB size 423 (i.e., the size of the DDB 421). In this example embodiment, the head or beginning of the DDB 421 is located at the DDB base 425 and the DDB 421 has a number of pieces of user data 419 equal to the DDB size 423.

The hierarchical data structures 400 may be variably sized based on the stability of the of phase change memory cells 200 of the memory devices 106. For example, the DDB 421 can be sized to always buffer user data 419 for the last one-hundred milliseconds of data writes to the memory devices 106. At one gigabit per second write rates, the DDB 321 would have to total one-hundred megabytes or roughly twenty-five thousand user data 419 entries of four kilobytes each. Power-of-two optimizations might increase this to 32,768 user data 419 entries (i.e., $2^{15}$). Furthermore, one embodiment includes buffering the last one second's worth of write timestamps 413C and overwrite counts 413D in the DET 405. At four kilobytes of granularity and one gigabit per second write rates, the DET 405 would need to hold approximately 250,000 DET entries 413. Power-of-two optimization might increase the number of DET entries 413 to 262,144 (i.e., $2^{18}$). To account for this number of DET entries 413 in the DET 405, the DET index 403A would have to be at least an eighteen-bit pointer to fully address every DET entry 413.

When a set of phase change memory cells 200 are written, the drift management system 116 may add a DET entry 413 to the DET 405. Additions of new DET entries 413 occur under three situations: (1) a DET entry 413 is being added to a non-full DET 405 (no overwriting necessary as the DET 405 is not full); (2) a DET entry 413 is being added to a full DET 405, but an existing DET entry 413 will not be overwritten; and (3) a DET entry 413 is being added to a full DET 405 and an existing DET entry 413 will be overwritten. In each situation, user data 419 is written to the memory devices $106_1$-$106_N$ (e.g., the phase change memory cells 200) simultaneous with the user data 419 being processed by the drift management system 116. Each of the three situations listed above for adding DET entries 413 will be described below.

With respect to adding a DET entry 413 to a non-full DET 405 without overwrite, the process can commence with indexing the MUA table 401 based on an address of the phase change memory cells 200 being written to locate the corresponding MUA entry 403. In this scenario, the located MUA entry 403 does not have an associated DET index 403A, which indicates that the phase change memory cells 200 corresponding to the MUA entry 403 do not have a corresponding DET entry 413. Accordingly, the DET entry 413 indicated by the head pointer 407 can be used for the DET index 403A. Based on this DET entry 413, the location for user data 419 in the DDB 421 can be determined as described above (e.g., the DDB offset for the user data 419 in the DDB 421 may be equal to the DET offset for the DET entry 413 modulus the DDB size 423). The user data 419 from the write operation that precipitated this new MUA entry 403 can thereafter be written to the determined location in the DDB 421. Subsequently, the fields of the DET entry 413 can be set, including setting the DDB flag 413B to one/True and setting the overwrite count 413D to zero. As noted above, the DET index 403A for the MUA entry 403 can be set to the head pointer 407 and the head pointer 407 can be incremented to a new DET entry 413.

With respect to adding a DET entry 413 to a full DET 405 without overwriting a MUA entry 403, the process can commence with indexing the MUA table 401 based on an address of the phase change memory cells 200 being written to locate the corresponding MUA entry 403. In this scenario, the located MUA entry 403 does not have an associated DET index 403A, which indicates that the phase change memory cells 200 corresponding to the MUA entry 403 do not have a corresponding DET entry 413. Accordingly, the DET entry 413 indicated by the head pointer 407 can be used for the DET index 403A of the previously located MUA entry 403. In some cases, the DET entry 413 indicated by the head pointer 407 may or may not be empty. When empty, the DET entry 413 of the head pointer 407 can be used. When not empty, the MUA entry 403 referencing the used DET entry 413 can have its DET index 403A cleared such that the DET entry 413 previously referenced by the DET index 403A is now free to use. The DET entry 413 indicated by the tail pointer 409 is identified and its DDB flag 413B is cleared. The tail pointer 409 is thereafter incremented to point to the next DET entry 413. The location in the DDB 421 indicated by the head pointer 407, which is the same location indicated by the tail pointer 409 before being incremented, is identified. The user data 419 from the write operation that precipitated this new MUA entry 403 can be written to the identified location in the DDB 421. Subsequently, the fields of the DET entry 413 can be set, including setting the DDB flag 413B to one/True and setting the overwrite count 413D to zero. As noted above, the DET index 403A for the MUA entry 403 can be set to the head pointer 407 and the head pointer 407 can be incremented to a new DET entry 413.

With respect to adding a DET entry 413 to a full DET 405 and overwriting a MUA entry 403, the process can commence with indexing the MUA table 401 based on an address of the phase change memory cells 200 being written to locate the corresponding MUA entry 403. In this scenario, the located MUA entry 403 does have an associated DET index 403A, which indicates that the phase change memory cells 200 corresponding to the MUA entry 403 have a corresponding DET entry 413. Based on this DET index 403A, the DET entry 413 can be located, the overwrite count 413D associated with the DET entry 413 can be captured and the DET entry 413 can be re-initialized to be empty. The DET entry 413 indicated by the head pointer 407 may now be used for the DET index 403A. In some cases, the DET entry 413 indicated by the head pointer 407 may or may not be empty. When empty, the DET entry 413 of the head pointer 407 can be used. When not empty, the MUA entry 403 referencing the used DET entry 413 can have its DET index 403A cleared such that the DET entry 413 previously referenced by the DET index 403A is now free to use. The DET entry 413 indicated by the tail pointer 409 is identified and its DDB flag 413B is cleared. The tail pointer 409 is thereafter incremented to point to the next DET entry 413. The location in the DDB 421 indicated by the head pointer 407, which is the same location indicated by the tail pointer 409 before being incremented, is identified. The user data 419 from the write operation that precipitated this new MUA entry 403 can be written to the identified location in the DDB 421. Subsequently, the fields of the DET entry 413 can be set, including setting the DDB flag 413B to one/True and the overwrite count 413D can be set to the previously captured value and incremented by one. As noted above, the DET index 403A for the MUA entry 403 can be set to the head pointer 407 and the head pointer 407 can be incremented to a new DET entry 413.

Figure 4B:
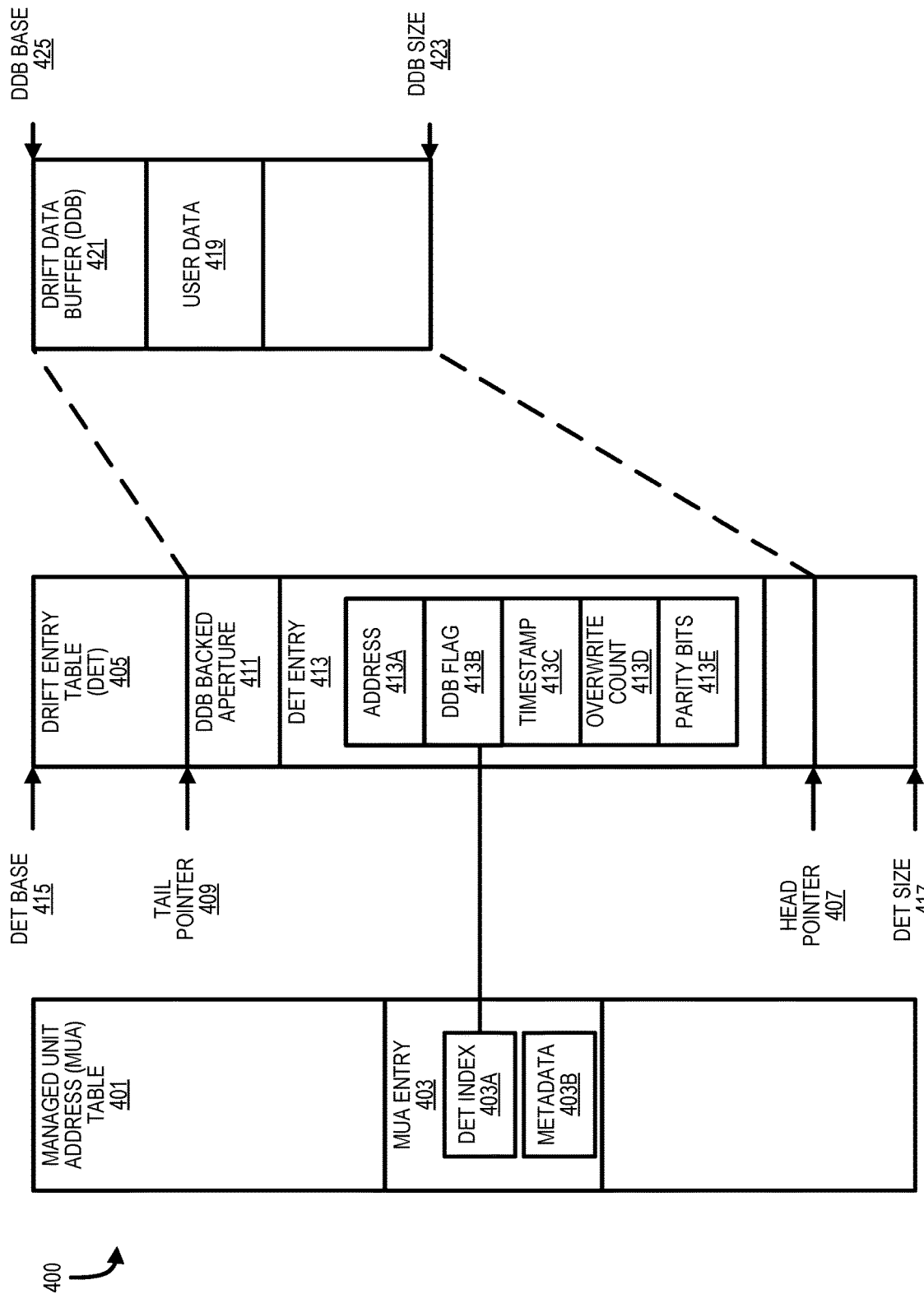
FIG. 4B shows a set of hierarchical data structures for accessing data from phase change memory cells, including parity bits stored in a drift entry table, in accordance with one or more embodiments.
Figure 4C:
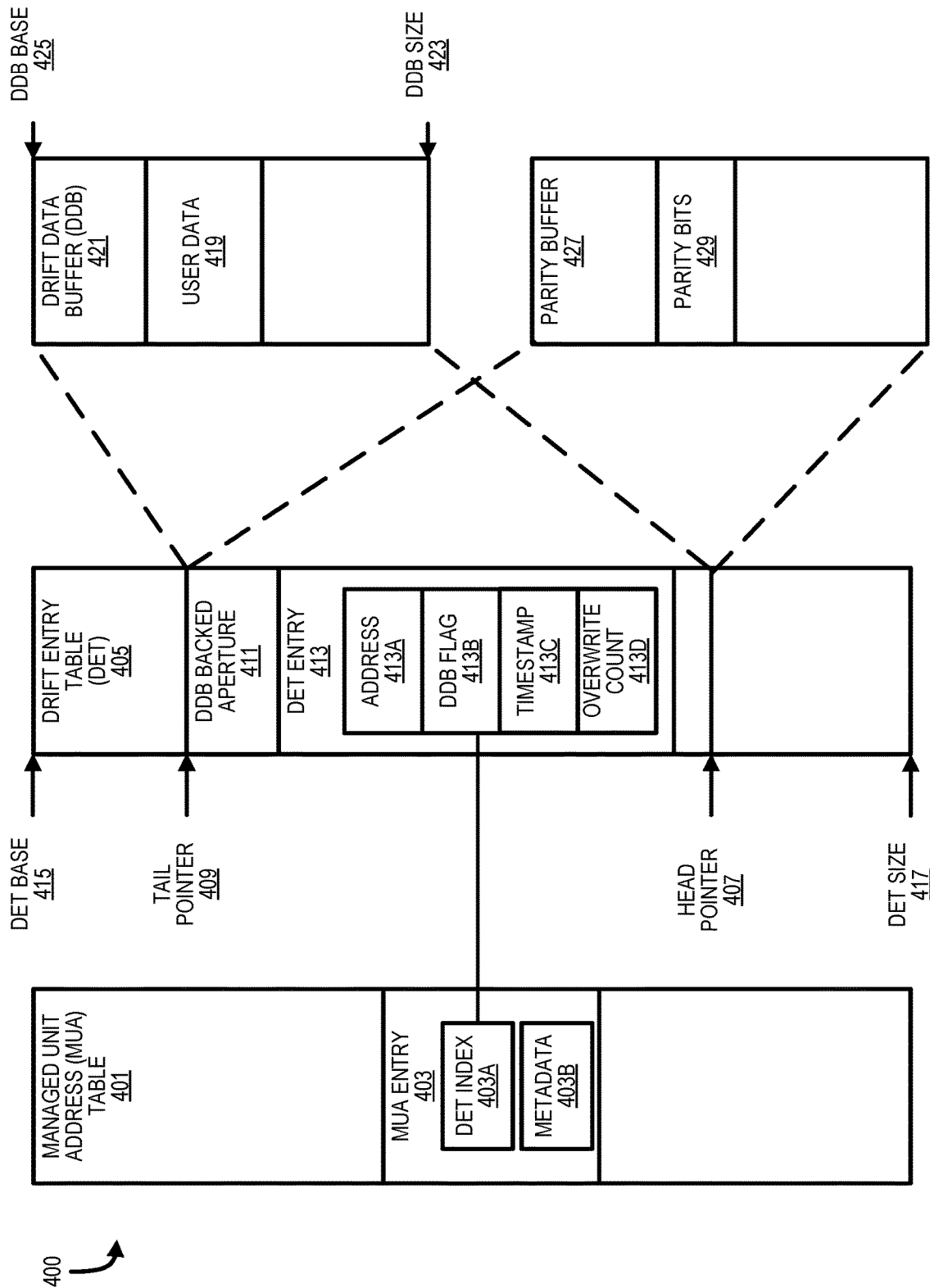
FIG. 4C shows a set of hierarchical data structures for accessing data from phase change memory cells, including parity bits stored in a parity buffer, in accordance with one or more embodiments.

Although the set of hierarchical data structures 400 has been described according to the specific embodiment shown in FIG. 4A, the set of hierarchical data structures 400 may include different elements in other embodiments. For example, although the parity bits for the user data 419 are described as being located in the MUA table 401 (i.e., in the metadata 403B for a corresponding MUA entry 403), the parity bits for the user data 419, which are stored separate from the user data 419 and provide stronger error correction than parity bits stored with the user data 419 in the phase change memory cells 200, may be stored in any location outside the phase change memory cells 200. For example, FIG. 4B shows an embodiment in which the parity bits are stored in the DET 405. In particular, each DET entry 413 includes parity bits 413E, which are populated by the method 500 at operation 509. In another embodiment, the parity bits for the user data 419 may be stored in another data structure of the hierarchical data structures 400 (separate from the MUA table 401, the DET 405, and DDB 421). For example, as shown in FIG. 4C, the parity bits 429 are present in a parity buffer 427 and can be accessed based on a corresponding offset relative to a DET entry 413 (e.g., in a similar fashion as the user data 419 is accessed from the DDB 421). Accordingly, as shown in FIGS. 4A-4C, the set of hierarchical data structures 400 are not limited to a specific configuration.

Figure 5:
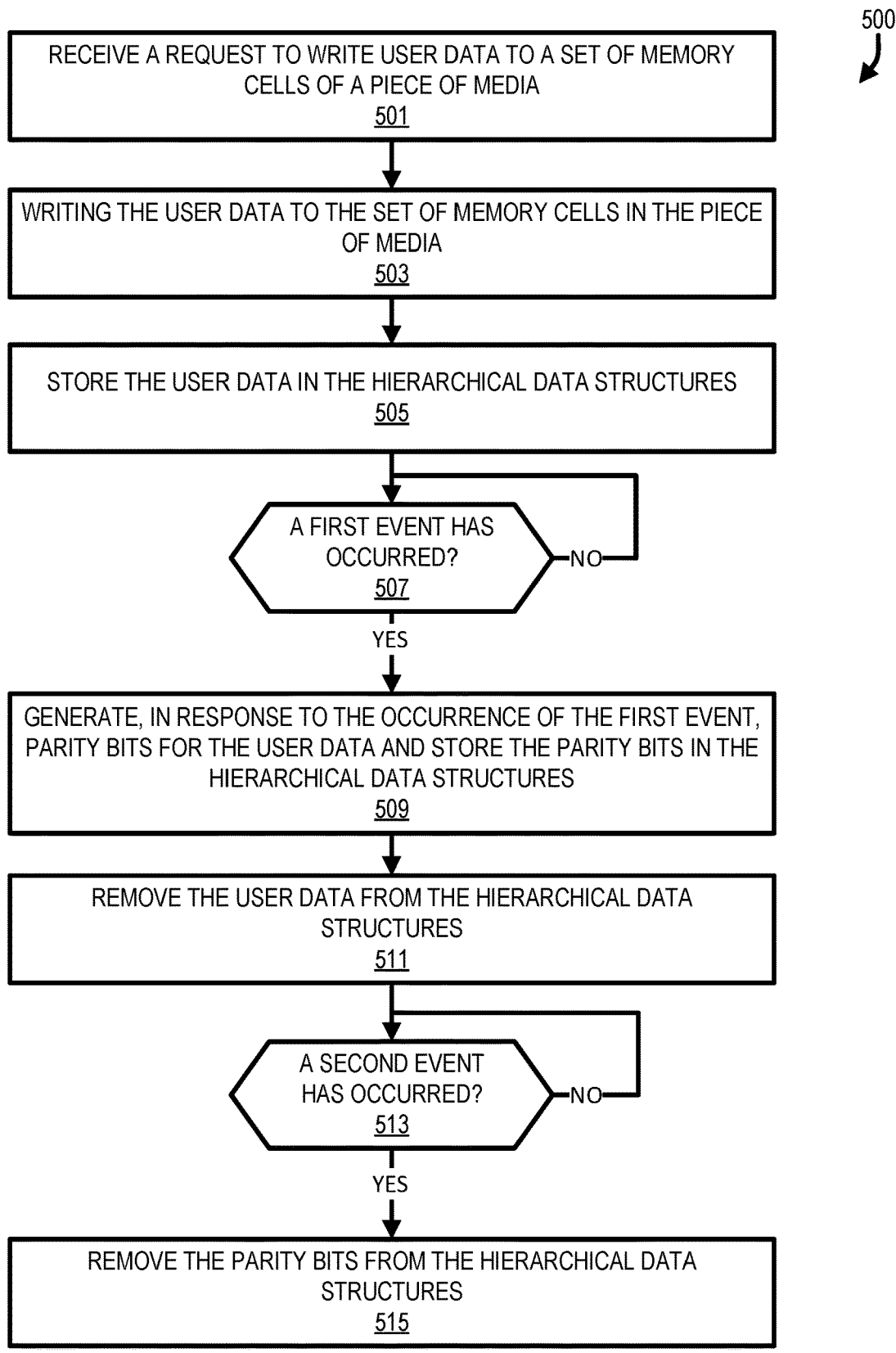
FIG. 5 shows a method for performing write operations to a phase change memory cell using the set of hierarchical data structures, in accordance with one or more embodiments.

As described above, several techniques can be used for adding MUA entries 403 to the MUA table 401 and associating these MUA entries 403 to DET entries 413 and locations in the DDB 421. Turning now to FIG. 5, a method 500 according to one embodiment will be described for performing write operations to phase change memory cells 200. The operations in FIG. 5 will be described with reference to the exemplary implementations of the other figures. However, it should be understood that the operations of the diagram can be performed by implementations other than those discussed with reference to the other figures, and the implementations discussed with reference to these other figures can perform operations different than those discussed with reference to the diagram. Although described and shown in FIG. 5 in a particular order, the operations of the method 500 are not restricted to this order. For example, one or more of the operations of the method 500 may be performed in a different order or in partially or fully overlapping time periods. Accordingly, the description and depiction of the method 500 is for illustrative purposes and is not intended to restrict to a particular implementation.

Each operation of the method 500 can be performed by one or more components of the computing system 100. For example, in some embodiments, the operations of the method 500 are performed by the drift management system 116 using the set of hierarchical data structures 400.

Although the method 500 will be described in relation to a single write of user data 419, the drift management system 116 can perform the operations of the method 500 simultaneously/concurrently for multiple writes. Accordingly, since the hierarchical data structures 400 are first-in-first-out structures with corresponding size limits, the drift management system 116 can cause the hierarchical data structures 400 to remove corresponding entries/data as the controller 104 processes new writes of user data 419.

The method 500 commences at operation 501 with the drift management system 116 receiving a request to write user data 419 to a set of phase change memory cells 200 of a piece/portion of media (e.g., the piece of media is a memory device 106). The request may include an address for writing the user data 419. In one embodiment, the piece of media is phase change media and the request is received from the host system 112. The drift management system 116 receives the request via the host interface 114 of the controller 104.

At operation 503, the controller 104 writes the user data 419 to the piece of media. In particular, the controller 104 writes the user data 419 to the set of phase change memory cells 200 by changing the phases of corresponding variable resistance materials 203 of the set of phase change memory cells 200.

At operation 505, the drift management system 116 stores/buffers/caches the user data 419 in the hierarchical data structures 400 for access during read operations. For example, as described above, the user data 419 can be written to the DDB 421 by adding a corresponding MUA entry 403 and DET entry 413 to the MUA table 401 and DET 405, respectively, using a variety of techniques. Storing the user data 419 in the hierarchical data structures 400 allows easy and error free retrieval/reading of the user data 419 while the phase change memory cells 200 are undergoing rapid resistivity drift. Namely, the user data 419 can be read from the hierarchical data structures 400 (e.g., the DDB 421) instead of the phase change memory cells 200 while the phase change memory cells 200 are difficult to read based on their rapid resistivity change. Since the hierarchical data structures 400 (e.g., the DDB 421) are not phase change memory cells, they do not suffer from resistivity drift issues. The hierarchical data structures 400 may be first-in-first-out structures that replace user data 419 after the occurrence of an event (e.g., after passage of a period of time (e.g., one millisecond since the user data 419 was written to the memory devices $106_1$-$106_N$) or one or more of the hierarchical data structure(s) reaching capacity (e.g., the DDB 421 reaching capacity)).

As described, the user data 419, which was the subject of the write request received at operation 501, can reside in both a memory device 106 and the hierarchical data structures 400 until the occurrence of an event that expels/removes this user data 419 from the hierarchical data structures 400. Accordingly, the controller 104 can retrieve user data 419 from either (1) the memory devices 106 or (2) the hierarchical data structures 400 to fulfill a read request. Although the user data 419 can be read/retrieved from either the memory devices 106 or the hierarchical data structures 400, reading the user data 419 may be less prone to error, particularly while the phase change memory cells 200 of the memory devices 106 are undergoing rapid resistivity drift. Following occurrence of an event that expels/removes this user data 419 from the hierarchical data structures 400, the user data 419 remains in only the memory devices 106 such that retrieval of the user data 419 must be made via the memory devices 106.

At operation 507, the drift management system 116 determines if an event (i.e., a first event) has occurred that would result in the user data 419, which were stored in the hierarchical data structures 400 at operation 503, being expelled/removed/erased from the hierarchical data structures 400. In one embodiment, as shown in FIG. 5, operation 507 waits until occurrence of an event. Upon occurrence of an event (e.g., passage of a period of time or one or more of the hierarchical data structure(s) reaching capacity (e.g., the DDB 421 reaching capacity)), the method 500 moves to operation 509. As noted above, the hierarchical data structures 400 are first-in-first out structures with corresponding size limitations. Since the drift management system 116 can simultaneously process multiple writes of user data 419, entries/data may continually be removed from the hierarchical data structures 400 as new writes are being processed. In this case, when the DDB 421 reaches capacity and as the drift management system 116 processes new writes, the drift management system 116 expels the oldest user data 419 from the DDB 419 to make room for the user data 419 from the newest user data 419 (i.e., first-in-first-out).

At operation 509, the drift management system 116 generates parity bits for the user data 419 and stores these generated parity bits in the hierarchical data structures 400 in response to the occurrence of an event. For example, the drift management system 116 can store generated parity bits as the metadata 403B in a corresponding MUA entry 403 of the MUA table 401. However, as shown in FIG. 4B and FIG. 4C, the parity bits generated at operation 509 can be stored in different data elements/structures (e.g., the parity bits 413E in a corresponding DET entry 413 or parity bits 429 of the parity buffer 427). In one embodiment, the parity bits generated at operation 509 offer stronger error correction than parity bits stored along with the user data 419 in the memory devices $106_1$-$106_N$. Namely, the parity bits generated at operation 509 allow for the correction of more bit errors in the user data 419 than the parity bits stored along with the user data 419 in the memory devices $106_1$-$106_N$ (e.g., the parity bits stored in the hierarchical data structures 400 can include more bits than the parity bits stored along with the user data 419 in the memory devices $106_1$-$106_N$). The strong error correction offered by the parity bits generated at operation 509 allows for the user data 419 to be read directly from the memory devices 106 even when the phase change memory cells 200 of the memory devices 106 are still drifting at a high rate.

After the drift management system 116 generates the parity bits at operation 509, the drift management system 116 removes the user data 419 from the hierarchical data structures 400 (e.g., removes/erases user data 419 from the DDB 421) at operation 511. In particular, removal of the user data 419 from the hierarchical data structures 400 frees up space for user data 419 that has been recently written to phase change memory cells 200 and can be more difficult to accurately read. As described above, the parity bits generated at operation 509 can be used for reading and correcting for errors in the user data 419 that is removed from the hierarchical data structures 400 at operation 511.

At operation 513, the drift management system 116 determines if an event (i.e., a second event) has occurred that would result in the parity bits, which were stored in the hierarchical data structures 400 at operation 509, to be expelled/removed from the hierarchical data structures 400. In one embodiment, as shown in FIG. 5, operation 513 waits until occurrence of an event (i.e., a second event). Upon occurrence of an event (e.g., passage of a period of time or one or more of the hierarchical data structure(s) reaching capacity (e.g., the MUA table 401 reaching capacity)), the method 500 moves to operation 515. For example, upon the elapsing of one-hundred milliseconds since the writing of the user data 419 to the phase change memory cells 200, operation 513 can detect the event (i.e., the second event) and the method 500 moves to operation 515. Specifically, when the MUA table 401 reaches capacity and as the drift management system 116 processes new writes, the drift management system 116 can expel the oldest MUA entry 403 from the MUA table 401 or metadata 403B of a MUA entry 403 to make room for a MUA entry 403 corresponding to the newest write (i.e., first-in-first-out).

At operation 515, the drift management system 116 removes/erases the parity bits generated and stored in the hierarchical data structures 400 at operation 509 from the hierarchical data structures 400. In particular, after the elapsing of certain amount of time since the writing of the user data 419 to the phase change memory cells 200 (e.g., one-hundred milliseconds), the resistivity of the phase change memory cells 200 may be in a more stable state and undergoing less drift (i.e., a lower degree of drift rate in comparison to the earlier periods of time). Thus, reading directly from the phase change memory cells 200 with only the parity bits offered within the memory devices 106 is sufficient to produce an accurate result (i.e., a valid and correct codeword). Thus, the parity bits can be removed from the hierarchical data structures 400 to free-up space at operation 515.

Figure 6A:
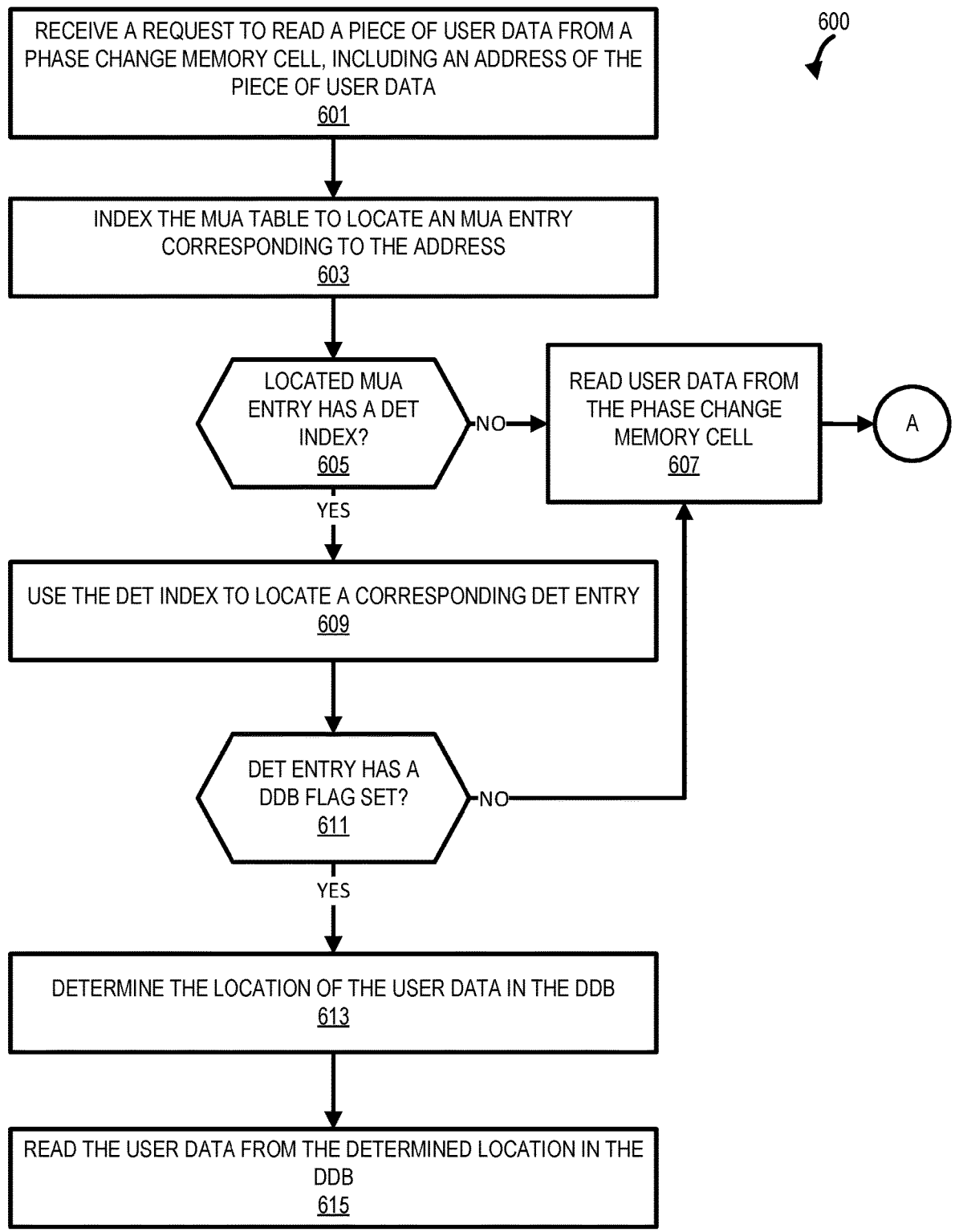
FIG. 6A and FIG. 6B show a method for performing read operations from the phase change memory cells using the set of hierarchical data structures, in accordance with one or more embodiments.
Figure 6B:
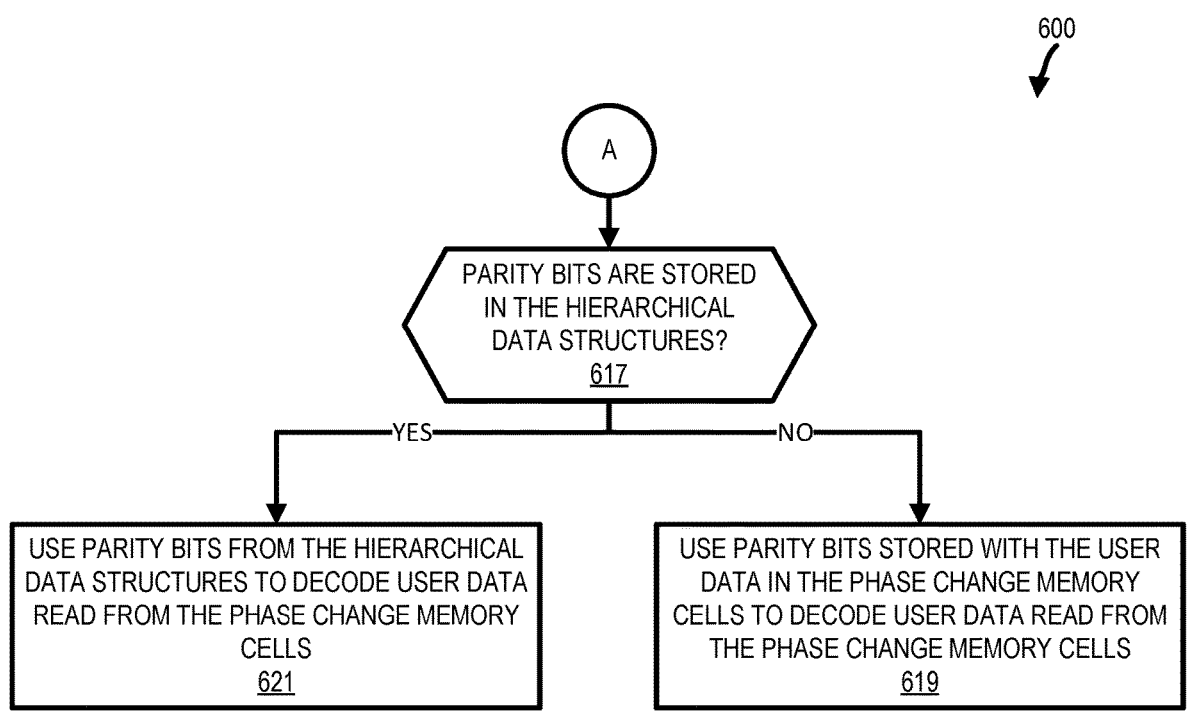

Turning now to FIGS. 6A and 6B, a method 600 according to one embodiment will be described for performing read operations from the phase change memory cells 200 that make memory devices $106_1$-$106_N$. The operations in the diagrams of FIGS. 6A and 6B will be described with reference to the exemplary implementations of the other figures. However, it should be understood that the operations of the diagrams can be performed by implementations other than those discussed with reference to the other figures, and the implementations discussed with reference to these other figures can perform operations different than those discussed with reference to the diagrams. Although described and shown in FIGS. 6A and 6B in a particular order, the operations of the method 600 are not restricted to this order. For example, one or more of the operations of the method 600 may be performed in a different order or in partially or fully overlapping time periods. Accordingly, the description and depiction of the method 600 is for illustrative purposes and is not intended to restrict to a particular implementation.

Each operation of the method 600 can be performed by one or more components of the computing system 100. For example, in some embodiments, the operations of the method 600 are performed by the drift management system 116 with assistance from the set of hierarchical data structures 400.

In some embodiments, the method 600 is performed in relation to the method 500. For example, the methods 500 and 600 can be performed concurrently or in at least partially overlapping time periods such that the method 500 is modifying the hierarchical data structures 400 and memory devices 106 and the method 600 is reading/utilizing the hierarchical data structures 400 and the memory devices 106 based on these modifications. Accordingly, in some embodiments, the methods 500 and 600 can be viewed as a single method for writing and reading user data 419.

In one embodiment, the method 600 commences at operation 601 with the drift management system 116 receiving a request to read a piece of user data 419 from a memory device 106 (i.e., a set of phase change memory cells 200). For example, the host system 112 can request a piece of user data 419 corresponding to a particular address (e.g., a MUA address). The drift management system 116 receives the request to read user data 419 from the host system 112 via the host interface 114 such that the controller 104 and, in particular, the drift management system 116 processes the request at operation 601.

In response to receipt of the request to read a piece of user data 419, the drift management system 116 or another component of the controller 104 indexes the MUA table 401 to locate an MUA entry 403 corresponding to the address of the requested piece of user data 419 at operation 603. As noted above, the MUA entry 403 can include a DET index 403A and/or metadata 403B. The DET index 403A, when present, indicates a DET entry 413 in the DET 405 corresponding to the MUA entry 403 while the metadata 403B can store parity bits. When the drift management system 116 determines at operation 605 that the DET index 403A is not present in the MUA entry 403, the user data 419 has not been buffered/is no longer buffered and the drift management system 116 reads the user data 419 directly from a memory device 106 (i.e., phase change memory cells 200) at operation 607. As will be described later, following operation 607, the method may continue via the connector A to the additional operations shown in FIG. 6B. When the drift management system 116 determines at operation 605 that the DET index 403A is present in the located MUA entry 403, the drift management system 116 uses the DET index 403A to locate a corresponding DET entry 413 in the DET 405 at operation 609.

Following the location of a DET entry 413 in the DET 405 at operation 609, the drift management system 116 determines at operation 611 whether the DET entry 413 has a DDB flag 413B set. The DDB flag 413B indicates whether the user data 419 requested at operation 601 and associated with the DET entry 413 is buffered in the DDB 421. When the DDB flag 413B of the DET entry 413 is not set, the DDB 421 does not have the user data 419 buffered and the user data 419 must be read directly from a memory device 106 (i.e., phase change memory cells 200) at operation 607. Conversely, when the DDB flag 413B of the DET entry 413 is set, the user data 419 has been buffered in the DDB 421 and thus may be read from the DDB 421 instead of from a memory device 106.

Upon the drift management system 116 determining at operation 611 that the DDB flag 413B of the DET entry 413 has been set and the user data 419 is buffered in the DDB 421, the drift management system 116 determines the location of the user data 419 in the DDB 421 at operation 613. In one embodiment, the drift management system 116 determines the location of the user data 419 in the DDB 421 as described above. In particular, the DET entry 413 located at operation 609 can be related/associated with user data 419 in the DDB 421 as designated by a DDB offset. For example, the DDB offset (i.e., the location for user data 419 in the DDB 421) can be equal to the DET offset for the DET entry 413 in the DET 405 modulus the DDB size 423 (i.e., the size of the DDB 421).

After the drift management system 116 determines the location of the user data 419 at operation 613, the drift management system 116 reads the user data 419 from the determined location in the DDB 421 and the drift management system 116 returns the read user data 419 to the requesting host system 112 at operation 615. As described, the user data 419 may be buffered and retrieved from the hierarchical data structures 400 instead of reading from the phase change memory cells 200. This action supports producing more accurate reads of user data 419 during a period of time when the phase change memory cells 200 are drifting at a higher rate (e.g., during the first one-millisecond after a write of the user data 419 to the memory devices 106) and reading directly from the phase change memory cells 200 is prone to errors.

As noted above, the drift management system 116 may read the user data 419 from the phase change memory cells 200 at operation 607. Following the drift management system 116 reading the user data 419 from the phase change memory cells 200, operation 617 may determine if the hierarchical data structures 400 include parity bits for the user data 419. In particular, the metadata 403B for the MUA entry 403 located at operation 603 can include parity bits that were generated for the user data 419 and operation 617 can determine if the hierarchical data structures 400 include parity bits for the user data 419 by examining the metadata 403B for the MUA entry 403. In the method 500, the drift management system 116 removes parity bits from a MUA entry 403 upon occurrence of an event (e.g., the MUA table 401 reaching capacity). The parity bits stored in the metadata 403B may provide more error correction capabilities that parity bits stored along with the user data 419 in the phase change memory cells 200. In particular, the parity bits stored in the metadata 403B can include more bits and correct for more bit errors than the parity bits stored along with the user data 419 in the phase change memory cells 200.

Upon the drift management system 116 determining that parity bits are not stored in the hierarchical data structures 400, the drift management system 116 uses the parity bits stored along with the user data 419 in the phase change memory cells 200 to decode the user data 419 and correct any errors at operation 619. In contrast, upon the drift management system 116 determining that parity bits are stored in the hierarchical data structures 400, the drift management system 116 uses the parity bits stored in the hierarchical data structures 400 to decode the user data 419 and correct any errors at operation 621. As described above, the parity bits stored in the hierarchical data structures 400 may offer more error correction capabilities than the parity bits stored along with the user data 419 in the phase change memory cells 200. In this fashion, the parity bits stored in the hierarchical data structures 400 can be used during a time period where reading the user data 419 from the phase change memory cells 200 may be problematic and prone to error (e.g., during the first one-hundred milliseconds since the user data 419 was written to the phase change memory cells 200). After this time period, the parity bits stored along with the user data 419 in the phase change memory cells 200 are specified and designed to be sufficient to correct any errors in the read user data 419 as the phase change memory cells 200 are now in a more stable (albeit still changing/drifting) state.

As described above, user data 419 and/or strong parity bits for the user data 419 can be buffered/cached/stored for use in supporting read requests. Accordingly, accuracy of reads can be improved by using user data 419 and/or strong parity bits buffered/cached/stored in the set of hierarchical data structures 400 without investing more space in the phase change memory cells 200 for parity bits or additional voltage read levels devoted to time periods when the phase change memory cells 200 are drifting at a higher rate (e.g., during the first one-milliseconds and/or one-hundred milliseconds since the user data 419 was written to the phase change memory cells 200).

It will be apparent from this description that aspects of the disclosure may be embodied, at least in part, in software or firmware. That is, a computer system or other data processing system, drift management system 116 of the controller 104, may carry out the computer-implemented methods 500 and/or 600 in response to its processor or other circuitry executing sequences of instructions contained in local memory/storage 110 or another non-transitory machine-readable storage medium. The software may further be transmitted or received over a network (not shown) via a network interface. In various embodiments, hardwired circuitry may be used in combination with the software instructions to implement the present embodiments. It will also be appreciated that additional components, not shown, may also be part of computing system 100, and, in some embodiments, fewer components than that shown in FIG. 1 may also be used in computing system 100.

An article of manufacture may be used to store program code providing at least some of the functionality of the embodiments described above. Additionally, an article of manufacture may be used to store program code created using at least some of the functionality of the embodiments described above. An article of manufacture that stores program code may be embodied as, but is not limited to, one or more memories (e.g., one or more flash memories, random access memories—static, dynamic, or other), optical disks, CD-ROMs, DVD-ROMs, EPROMs, EEPROMs, magnetic or optical cards or other type of non-transitory machine-readable media suitable for storing electronic instructions. Additionally, embodiments of the invention may be implemented in, but not limited to, hardware or firmware utilizing an FPGA, ASIC, a processor, a computer, or a computer system including a network. Modules and components of hardware or software implementations can be divided or combined without significantly altering embodiments of the invention.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

In the foregoing specification, the invention has been described with reference to specific exemplary embodiments thereof. Various embodiments and aspects of the invention(s) are described with reference to details discussed in this document, and the accompanying drawings illustrate the various embodiments. The description above and drawings are illustrative of the invention and are not to be construed as limiting the invention. References in the specification to "one embodiment," "an embodiment," "an exemplary embodiment," etc., indicate that the embodiment described may include a particular feature, structure, or characteristic, but not every embodiment may necessarily include the particular feature, structure, or characteristic. Moreover, such phrases are not necessarily referring to the same embodiment. Furthermore, when a particular feature, structure, or characteristic is described in connection with an embodiment, such feature, structure, or characteristic may be implemented in connection with other embodiments whether or not explicitly described. Additionally, as used in this document, the term "exemplary" refers to embodiments that serve as simply an example or illustration. The use of exemplary should not be construed as an indication of preferred examples. Blocks with dashed borders (e.g., large dashes, small dashes, dot-dash, dots) are used to illustrate optional operations that add additional features to embodiments of the invention. However, such notation should not be taken to mean that these are the only options or optional operations, and/or that blocks with solid borders are not optional in some embodiments of the invention. Numerous specific details are described to provide a thorough understanding of various embodiments of the present invention. However, in certain instances, well-known or conventional details are not described in order to provide a concise discussion of embodiments of the present inventions.

It will be evident that various modifications may be made thereto without departing from the broader spirit and scope of the invention as set forth in the following claims. For example, the methods described in this document may be performed with fewer or more features/blocks or the features/blocks may be performed in differing orders. Additionally, the method(s) described in this document may be repeated or performed in parallel with one another or in parallel with different instances of the same or similar methods. While examples refer to memory and non-volatile storage media, embodiments may also be implemented with other types of storage media.

What is claimed is:

1. A computer-implemented method for writing data to a first media using a set of data structures to reduce potential errors when reading the data from the first media, comprising:

writing user data to a set of memory cells in the first media; and storing, in response to writing the user data to the set of memory cells, a first set of parity bits associated with the user data in a first buffer that is held within a second media separate from the first media and is a different type than the first media, wherein the first set of parity bits provide error correction information for correcting errors introduced to the user data while stored in the set of memory cells or read from the set of memory cells, wherein the user data includes a second set of parity bits that are distinct from the first set of parity bits and provide error correction information for correcting errors introduced to the user data while stored in the set of memory cells or read from the set of memory cells.

2. The computer-implemented method of claim 1, wherein the first set of parity bits includes more bits than the second set of parity bits such that the first set of parity bits provides greater error correction capabilities than the second set of parity bits.

3. The computer-implemented method of claim 1, further comprising:

storing, in response to writing the user data to the set of memory cells, the user data in a second buffer, wherein storing the first set of parity bits in the first buffer is performed further in response to an occurrence of a first event.

4. The computer-implemented method of claim 3, wherein the first event is one of: (a) the second buffer reaching capacity and (b) elapsing of a first period of time since the writing of the user data to the set of memory cells.

5. The computer-implemented method of claim 4, further comprising:

removing the user data from the second buffer following the occurrence of the first event.

6. The computer-implemented method of claim 5, further comprising:

removing the first set of parity bits from the first buffer in response to an occurrence of a second event, wherein the second event is one of: (a) the first buffer reaching capacity and (b) elapsing of a second period of time since the writing of the user data to the set of memory cells, wherein the second period of time extends later in time than the first period of time.

7. The computer-implemented method of claim 6, further comprising:

receiving a request for the user data;

reading the user data from the second buffer in response to determining that the second event has not occurred;

reading the user data from the set of memory cells and using the first set of parity bits to decode the user data in response to determining that the second event has occurred but the first event has not occurred; and reading the user data from the set of memory cells and using the second set of parity bits to decode the user data in response to determining that the first event and the second event have occurred.

8. A system comprising:
a memory device comprising a set of memory cells in a first media;
a host interface to receive a request to write user data to the set of memory cells in the first media; and
a processing device operatively coupled to the memory device and the host interface to write the user data to the set of memory cells in the first media and store, in response to receiving the request to write the user data to the set of memory cells, a first set of parity bits associated with the user data in a first buffer that is held within a second media separate from the first media and is a different type than the first media, wherein the first set of parity bits provide error correction information for correcting errors introduced to the user data while stored in the set of memory cells or read from the set of memory cells,
wherein the user data includes a second set of parity bits that are distinct from the first set of parity bits and provide error correction information for correcting errors introduced to the user data while stored in the set of memory cells or read from the set of memory cells.

9. The system of claim 8, wherein the first set of parity bits includes more bits than the second set of parity bits such that the first set of parity bits provides greater error correction capabilities than the second set of parity bits.

10. The system of claim 8, wherein the drift management system is to further store, in response to receiving the request to write the user data to the set of memory cells, the user data in a second buffer,
wherein storing the first set of parity bits to the first buffer is performed further in response to an occurrence of a first event.

11. The system of claim 10, wherein the first event is one of: (a) the second buffer reaching capacity and (b) the elapsing of a first period of time since the writing of the user data to the set of memory cells.

12. The system of claim 11, wherein the drift management system is to further remove the user data from the second buffer following the occurrence of the first event.

13. The system of claim 12, wherein the drift management system is to further remove the first set of parity bits from the first buffer in response to an occurrence of a second event,
wherein the second event is one of: (a) the first buffer reaching capacity and (b) the elapsing of a second period of time since the writing of the user data to the set of memory cells, wherein the second period of time is longer than the first period of time.

14. The system of claim 13, wherein the host interface is to receive a request for the user data, and
wherein the drift management system is to further read the user data from the second buffer in response to determining that the second event has not occurred; read the user data from the set of memory cells and use the first set of parity bits to decode the user data in response to determining that the second event has occurred but the first event has not occurred; and
read the user data from the set of memory cells and use the second set of parity bits to decode the user data in response to determining that the first event and the second event have occurred.

15. A non-transitory machine-readable storage medium, which stores instructions that, when executed by a processor, cause the processor to:
write user data to a set of memory cells in a first media;
store, in response to writing the user data to the set of memory cells, a first set of parity bits associated with the user data in a first buffer that is held within a second media separate from the first media and is a different type than the first media, wherein the first set of parity bits provide error correction information for correcting errors introduced to the user data while stored in the set of memory cells;
receive a request for the user data; and
read the user data from the set of memory cells using the first set of parity bits to decode the user data in response to determining that a first event has not occurred, but a second event has occurred.

16. The non-transitory machine-readable storage medium of claim 15, wherein the instructions further cause the processor to:
store, in response to writing the user data to the set of memory cells, the user data in a second buffer,
wherein storing the first set of parity bits to the first buffer is performed further in response to an occurrence of the first event, and
wherein the first event is one of the second buffer reaching capacity and the elapsing of a first period of time since the writing of the user data to the set of memory cells.

17. The non-transitory machine-readable storage medium of claim 16, wherein the instructions further cause the processor to:
remove the user data from the second buffer following the occurrence of the first event.

18. The non-transitory machine-readable storage medium of claim 17, wherein the instructions further cause the processor to:
remove the first set of parity bits from the first buffer in response to an occurrence of the second event,
wherein the second event is one of: (a) the first buffer reaching capacity and (b) the elapsing of a second period of time since the writing of the user data to the set of memory cells, wherein the second period of time is longer than the first period of time.

* * * * *